United States Patent
Homm Jara et al.

(10) Patent No.: US 12,448,683 B2
(45) Date of Patent: *Oct. 21, 2025

(54) METHOD OF FORMING A VANADIUM NITRIDE-CONTAINING LAYER

(71) Applicant: ASM IP Holding B.V., Almere (NL)

(72) Inventors: Pia Homm Jara, Leuven (BE); Werner Knaepen, Leuven (BE); Dieter Pierreux, Dilbeek (BE); Bert Jongbloed, Oud-Heverlee (BE); Panagiota Arnou, Leuven (BE); Ren-Jie Chang, Leuven (BE); Qi Xie, Wilsele (BE); Giuseppe Alessio Verni, Vantaa (FI); Gido van der Star, Leuven (BE)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/404,983

(22) Filed: Jan. 5, 2024

(65) Prior Publication Data

US 2024/0150892 A1    May 9, 2024

Related U.S. Application Data

(63) Continuation of application No. 17/113,301, filed on Dec. 7, 2020, now Pat. No. 11,898,243.

(Continued)

(51) Int. Cl.
*C23C 16/34* (2006.01)
*C23C 16/04* (2006.01)
(Continued)

(52) U.S. Cl.
CPC .............. *C23C 16/34* (2013.01); *C23C 16/04* (2013.01); *C23C 16/4408* (2013.01);
(Continued)

(58) Field of Classification Search
CPC ..... C23C 16/34; C23C 16/04; C23C 16/4408; C23C 16/45525; C23C 16/45527
See application file for complete search history.

(56) References Cited

U.S. PATENT DOCUMENTS 6,156,395 A * 12/2000 Zhang .................. C23C 16/405
                                                                              427/126.3
8,937,022 B2    1/2015 Ogawa
(Continued)

FOREIGN PATENT DOCUMENTS

EP          3121309 A1 *  1/2017 ............. C23C 16/30
JP       2000091269 A      3/2000
(Continued)

OTHER PUBLICATIONS

Dai, Z.N., et al., "Crystalline and nearly stoichiometric vanadium nitride thin film by PLD". Thin Solid Films 347 (1999) 117-120.*
(Continued)

*Primary Examiner* — Bret P Chen
(74) *Attorney, Agent, or Firm* — Snell & Wilmer L.L.P.

(57) ABSTRACT

Methods of forming a vanadium nitride-containing layer. The method comprises providing a substrate within a reaction chamber of a reactor and depositing a vanadium nitride-containing layer onto a surface of the substrate, wherein the deposition process comprises providing a vanadium precursor to the reaction chamber and providing a nitrogen precursor to the reaction chamber. The disclosure further relates to structures and devices comprising the vanadium nitride-containing layer.

20 Claims, 4 Drawing Sheets

Related U.S. Application Data

(60) Provisional application No. 63/015,226, filed on Apr. 24, 2020.

(51) Int. Cl.
  *C23C 16/44* (2006.01)
  *C23C 16/455* (2006.01)
  *C23C 16/56* (2006.01)
  *H01L 21/285* (2006.01)

(52) U.S. Cl.
  CPC .. *C23C 16/45527* (2013.01); *C23C 16/45544* (2013.01); *C23C 16/56* (2013.01); *H01L 21/28568* (2013.01)

(56) References Cited

U.S. PATENT DOCUMENTS

| | | | |
|---|---|---|---|
| 9,691,771 B2* | 6/2017 | Lansalot-Matras | C23C 16/42 |
| 10,882,874 B2 | 1/2021 | Okabe et al. | |
| 11,898,243 B2* | 2/2024 | Homm Jara | H01L 21/76876 |
| 12,237,171 B1* | 2/2025 | Alessio Verni | C23C 16/52 |
| 2002/0009872 A1 | 1/2002 | Hoshino et al. | |
| 2009/0166870 A1* | 7/2009 | Kim | H01L 21/76846 438/643 |
| 2013/0243956 A1 | 9/2013 | Ma | |
| 2016/0304542 A1* | 10/2016 | Lansalot-Matras | C23C 16/45525 |
| 2016/0307797 A1 | 10/2016 | Farmer et al. | |
| 2019/0177346 A1* | 6/2019 | Okabe | C07F 9/005 |
| 2019/0189906 A1 | 6/2019 | Lee et al. | |
| 2024/0191355 A1* | 6/2024 | Ivanov | H01L 21/28562 |

FOREIGN PATENT DOCUMENTS

| | | | | |
|---|---|---|---|---|
| JP | 2000208720 A | | 7/2000 | |
| JP | 2004-323493 A | * | 11/2004 | C07F 9/00 |
| JP | 2009044056 A | | 2/2009 | |
| JP | 2017-226614 A | * | 12/2017 | C07F 9/00 |
| WO | WO 2013162546 A1 | * | 10/2013 | H01G 4/005 |
| WO | WO 2017/221586 A1 | * | 12/2017 | C07C 251/08 |

OTHER PUBLICATIONS

Suszkl, Tomasz, et al., "Preferentially oriented vanadium nitride films deposited by magnetron sputtering". Materials Letters, vol. 65, Issue 14, Jul. 31, 2011, pp. 2146-2148.*

Kozen, Alexander C., et al., "Plasma-enhanced atomic layer deposition of vanadium nitride". J. Vac. Sci. Technol. A 37(6), Nov./Dec. 2019, 061505, pp. 1-8.*

Takeyama, Mayumi B., et al., "Atomic Layer Deposition of Thin $VN_x$ Film from Tetrakis(diethylamido)vanadium Precursor". Japanese Journal of Applied Physics 50 (2011) 05EA06, pp. 1-2.*

Rampelberg, Geert, "Low temperature plasma-enhanced atomic layer deposition of thin vanadium nitride layers for copper diffusion barriers". Appl. Phys. Lett. 102, 111910 (2013) pp. 1-4.*

Rampelberg, Geert, "Thin Film Synthesis of VO2 and VN by Gas-Solid Reactions and Atomic Layer Deposition". Thesis submitted to Ghent University, Faculty of Sciences, Department of Solid State Sciences, Krijglaan 281/S1, 9000 Ghent, Belgium. Mar. 2016. 4 pages. Abstract Only.*

* cited by examiner

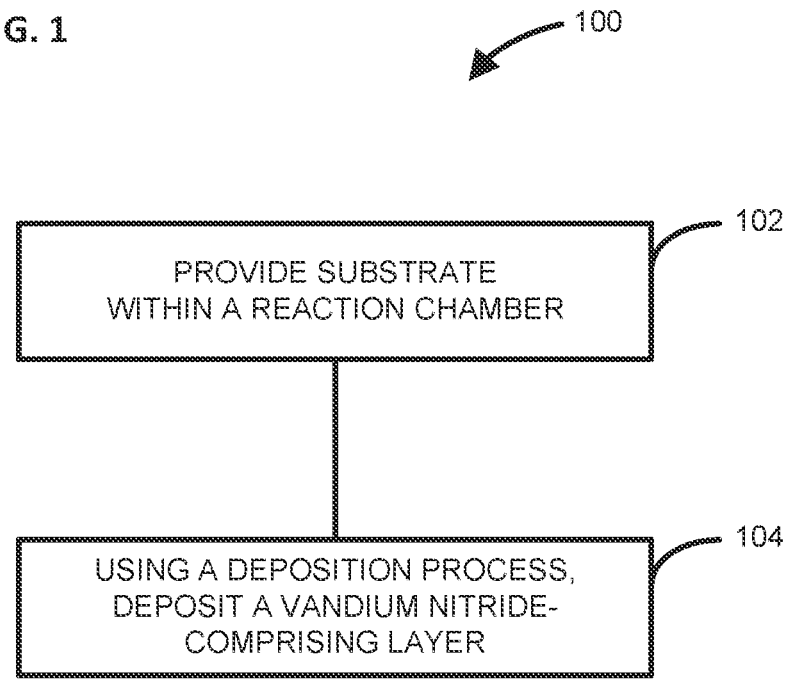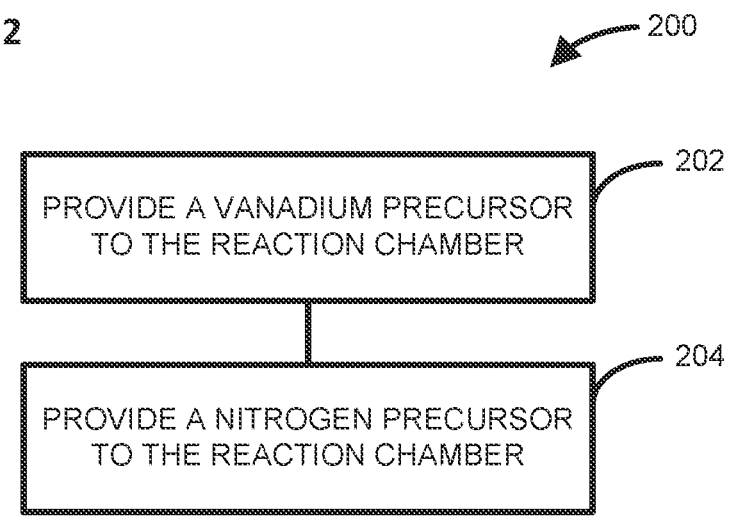

METHOD OF FORMING A VANADIUM NITRIDE-CONTAINING LAYER

CROSS-REFERENCE TO RELATED APPLICATIONS

This application is a continuation of, and claims priority to, U.S. patent application Ser. No. 17/113,301 filed Dec. 7, 2020 and titled METHOD OF FORMING VANADIUM NITRIDE-CONTAINING LAYER AND STRUCTURE COMPRISING THE SAME, now U.S. Pat. No. 11,898,243; which claims priority to and the benefit of U.S. Provisional Patent Application Ser. No. 63/015,226 filed Apr. 24, 2020 and titled METHOD OF FORMING VANADIUM NITRIDE-CONTAINING LAYER AND STRUCTURE COMPRISING THE SAME, the disclosures of which are hereby incorporated by reference in their entirety.

FIELD

The present disclosure generally relates to methods and systems suitable for producing thin films. More particularly, the current disclosure relates to methods and systems for producing a vanadium nitride-containing layer by a deposition process and a structure comprising the same.

BACKGROUND

The scaling of semiconductor devices, such as, for example, complementary metal-oxide-semiconductor (CMOS) devices, has led to significant improvements in speed and density of integrated circuits. However, conventional device scaling techniques face significant challenges for future technology nodes.

For example, one challenge has been finding a suitable conducting material for use as a gate electrode in the CMOS devices. CMOS devices have conventionally used n-type doped polysilicon as the gate electrode material. However, doped polysilicon may not be an ideal gate electrode material for advanced node applications. Although doped polysilicon is conductive, there may still be a surface region which can be depleted of carriers under bias conditions. This region may appear as an extra gate insulator thickness, commonly referred to as gate depletion, and may contribute to the equivalent oxide thickness. While the gate depletion region may be thin, on the order of a few angstroms (Å), the gate depletion region may become significant as the gate oxide thicknesses are reduced in advanced node applications. As a further example, polysilicon does not exhibit an ideal effective work function (eWF) for both NMOS and PMOS devices. To overcome the non-ideal effective work function of doped polysilicon, a threshold voltage adjustment implantation may be utilized. However, as device geometries reduce in advanced node applications, the threshold voltage adjustment implantation processes may become increasingly complex and impractical.

To overcome problems associated with doped polysilicon gate electrodes, polysilicon gate material may be replaced with an alternative material, such as, for example, a metal, such as a titanium nitride layer. The titanium nitride layer may provide a more ideal effective work function for CMOS applications. However, in some cases, where higher work function values than those obtained with titanium nitride layers—e.g., in PMOS regions of a CMOS device—are desired, improved materials are desired. Such materials may be suitable for electrode/capacitor applications, such as for gate electrodes, threshold voltage tuning, a p-dipole shifter or dynamic random access memory (DRAM) applications.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of forming vanadium nitride-containing layers, to structures and devices formed using such methods, and to apparatus for performing the methods and/or for forming the structures and/or devices. While the ways in which various embodiments of the present disclosure address drawbacks of prior methods and systems are discussed in more detail below, in general, various embodiments of the disclosure provide improved methods of forming vanadium nitride-containing layers that exhibit relatively high work function values. Additionally or alternatively, vanadium nitride-containing layers can be formed using one or more vanadium precursors. Further, exemplary vanadium nitride-containing layers can be formed using a thermal cyclical deposition process. It may also be possible to form them using plasma or plasma-activated species.

In this disclosure, "gas" can include material that is a gas at normal temperature and pressure (NTP), a vaporized solid and/or a vaporized liquid, and can be constituted by a single gas or a mixture of gases, depending on the context. A gas other than a process gas, i.e., a gas introduced without passing through a gas distribution assembly, other gas distribution device, or the like, can be used for, e.g., sealing the reaction space, and can include a seal gas, such as a rare gas.

The term "precursor" can refer to a compound that participates in the chemical reaction that produces another compound. The term reactant can be used interchangeably with the term precursor. The term "inert gas" can refer to a gas that does not take part in a chemical reaction and/or does not become a part of a layer to an appreciable extent. Exemplary inert gases include He and Ar and any combination thereof. In some cases, molecular nitrogen and/or hydrogen can be an inert gas.

As used herein, the term "purge" may refer to a procedure in which an inert or substantially inert gas is provided to a reactor chamber in between two pulses of gasses which react with each other. For example, a purge, or purging, e.g. using nitrogen gas, may be provided between pulses of two precursors, thus avoiding or at least minimizing gas phase interactions between the two precursors. It shall be understood that a purge can be effected either in time or in space, or both. For example in the case of temporal purges, a purge step can be used e.g. in the temporal sequence of providing a first precursor to a reactor chamber, providing a purge gas to the reactor chamber, and providing a second precursor to the reactor chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied.

As used herein, the term "substrate" can refer to any underlying material or materials that can be used to form, or upon which, a structure, a device, a circuit, or a layer can be formed. A substrate can include a bulk material, such as silicon (e.g., single-crystal silicon), other Group IV materials, such as germanium, or other semiconductor materials, such as a Group II-VI or Group III-V semiconductor materials, and can include one or more layers overlying or underlying the bulk material. Further, the substrate can include various features, such as recesses, protrusions, and the like formed within or on at least a portion of a layer of the substrate. For example, a substrate can include bulk semiconductor material and an insulating or dielectric material layer overlying at least a portion of the bulk semiconductor material.

As used herein, the term "film" and/or "layer" can refer to any continuous or non-continuous structure and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. A seed layer may be a non-continuous layer serving to increase the rate of nucleation of another material. However, the seed layer may also be substantially or completely continuous.

As used herein, a "structure" can be or include a substrate as described herein. Structures can include one or more layers overlying the substrate, such as one or more layers formed according to a method according to the current disclosure.

The term cyclic deposition process or cyclical deposition process can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component. The process may comprise a purge step between introducing precursors.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, when performed with alternating pulses of precursor(s)/reactive gas(es), and purge (e.g., inert carrier) gas(es).

Generally, for ALD processes, during each cycle, a precursor is introduced to a reaction chamber and is chemisorbed to a deposition surface (e.g., a substrate surface that can include a previously deposited material from a previous ALD cycle or other material), forming about a monolayer or sub-monolayer of material that does not readily react with additional precursor (i.e., a self-limiting reaction). Thereafter, in some cases, a reactant (e.g., another precursor or reaction gas) may subsequently be introduced into the process chamber for use in converting the chemisorbed precursor to the desired material on the deposition surface. The reactant can be capable of further reaction with the precursor. Purging steps may be utilized during one or more cycles, e.g., during each step of each cycle, to remove any excess precursor from the process chamber and/or remove any excess reactant and/or reaction byproducts from the reaction chamber.

As used herein, a "vanadium nitride-containing layer" can be a material layer that can be represented by a chemical formula that includes vanadium and nitrogen. A vanadium nitride layer can include additional elements, such as oxygen (e.g., a vanadium oxynitride layer) and the like. In some embodiments, the vanadium nitride-containing layer may comprise significant proportions of other elements than vanadium and nitride. In some embodiments, the vanadium nitride-containing layer comprises vanadium nitride (VN). In some embodiments, the vanadium nitride-containing layer may comprise, for example, 80, 90, 95 or 99 atomic percentage (at %) of VN. In some embodiments, the vanadium nitride-containing layer may consist essentially of vanadium nitride. In some embodiments, the vanadium nitride-containing layer may consist of vanadium nitride. Layer consisting of vanadium nitride may include an acceptable amount of impurities, such as oxygen, carbon, chlorine or other halogen, and/or hydrogen that may originate from one or more precursors used to deposit the vanadium nitride-containing layer.

In some embodiments, the vanadium content of the vanadium nitride-containing layer is from at least 1.0 atomic percent to at most 99.0 atomic percent, or from at least 3.0 atomic percent to at most 97.0 atomic percent, or from at least 5.0 atomic percent to at most 95.0 atomic percent, or from at least 10.0 atomic percent to at most 90.0 atomic percent, or from at least 20.0 atomic percent to at most 80.0 atomic percent, or from at least 30.0 atomic percent to at most 70.0 atomic percent, or from at least 40.0 atomic percent to at most 60.0 atomic percent.

In some embodiments, the nitrogen content of the vanadium nitride-containing layer is from at least 1.0 atomic percent to at most 99.0 atomic percent, or from at least 3.0 atomic percent to at most 97.0 atomic percent, or from at least 5.0 atomic percent to at most 95.0 atomic percent, or from at least 10.0 atomic percent to at most 90.0 atomic percent, or from at least 20.0 atomic percent to at most 80.0 atomic percent, or from at least 30.0 atomic percent to at most 70.0 atomic percent, or from at least 40.0 atomic percent to at most 60.0 atomic percent.

As used herein, a vanadium precursor includes a gas or a material that can become gaseous and that can be represented by a chemical formula that includes vanadium, such as one or more of vanadium halides, vanadium alkylamido compounds and vanadium amidinate compounds. Vanadium precursor may be an organic or inorganic molecule.

The term nitrogen precursor can refer to a gas or a material that can become gaseous and that can be represented by a chemical formula that includes nitrogen. In some cases, the chemical formula includes nitrogen and hydrogen. In some cases, the nitrogen precursor does not include diatomic nitrogen.

Deposition is generally defined as selective if the amount of the deposited material per surface area or volume (e.g. $at/cm^2$ or $at/cm^3$) on the first surface material is greater than the amount of the deposited material per surface area or volume on the second surface material. The amount of material deposited on the surface materials can be determined by measuring the thicknesses of each layer. In some cases, the thickness measurement might not be possible due to non-continuous film. In some cases the selectivity can be determined by measuring the deposited atoms per surface area or volume. As mentioned above, the selectivity can be expressed as the ratio of material formed on the first surface material to amount of material formed on the first and second surface materials combined.

Selectivity of deposition on first surface material relative to second surface material can be given as a percentage calculated by [(deposition on first surface material)-(deposition on second surface material)]/(deposition on the first surface material). Deposition can be measured in any of a variety of ways. For example, deposition may be given as the measured thickness of the deposited material, or may be given as the measured amount of material deposited. In embodiments described herein, selective deposition of a vanadium nitride-containing layer can be conducted on a first surface material relative to a second surface material.

Preferably, the selectivity is above about 70%, above about 80%, more preferably above 90%, even more preferably above 95%, and most preferably about 100%. In some cases selectivity above 80% may be acceptable for certain applications. In some cases selectivity above 50% may be acceptable for certain applications.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings FIG. 1 illustrates the method according to the current disclosure.

FIG. 2 illustrates an embodiment of the method according to the current disclosure.

DETAILED DESCRIPTION OF EXEMPLARY EMBODIMENTS

Figure 3:
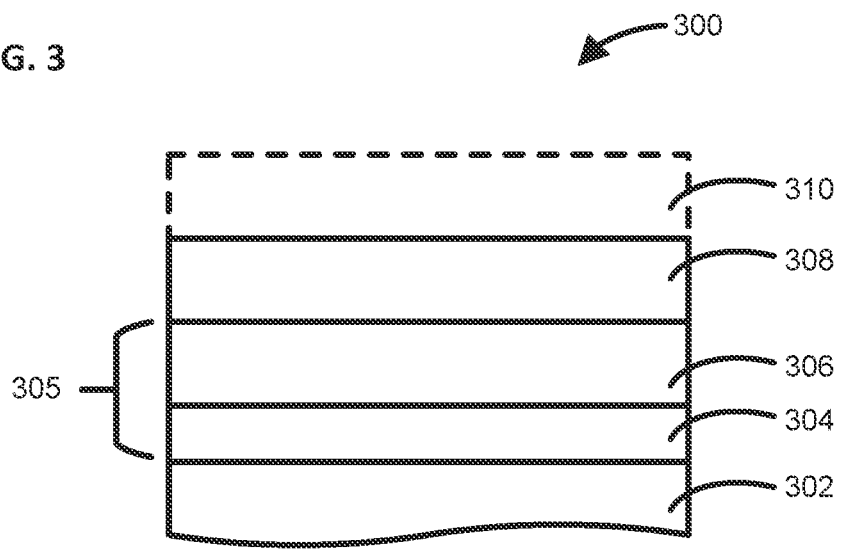
FIG. 3 depicts a structure comprising a vanadium nitride-containing layer according to the current disclosure.

The description of exemplary embodiments of methods, structures, devices and apparatuses provided below is merely exemplary and is intended for purposes of illustration only. The following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

The current disclosure relates to a method of forming a vanadium nitride-containing layer. The method comprises providing a substrate within a reaction chamber of a reactor and depositing a vanadium nitride-containing layer onto a surface of the substrate. In the method according to the current disclosure the deposition process comprises (e.g., sequentially and separately) providing a vanadium precursor to the reaction chamber and providing a nitrogen precursor to the reaction chamber.

The method according to the current disclosure may be used to produce a structure comprising the vanadium nitride-containing layer and a device comprising the vanadium nitride-containing layer. The vanadium nitride-containing layer and structure according to the current disclosure may be used as work function metal in metal gates, liner/barrier, metal electrode (DRAM, Logic, 3DNAND) and also p-metal gate for logic and also as a dipole (p) tuning layer for logic and other applications.

The method according to current disclosure may be performed in a batch processing tool, such as a vertical furnace, in a minibatch, in a single-wafer or a spatial reactor.

In an embodiment, the vanadium precursor may comprise an organic compound. In another embodiment, the vanadium precursor may comprise an inorganic compound.

The organic vanadium precursors may comprise one or more of a vanadium alkylamido precursor, vanadium dialkylamido precursor, vanadium amidinate precursor, vanadium alkoxide precursor, vanadyl alkoxide precursor, vanadium beta-diketonate precursor and a vanadium cyclopentadienyl precursor.

The following abbreviations shall be used throughout this disclosure: Me stands for methyl ($CH_3$) and Et for ethyl ($C_2H_5$). $^nPr$ stands for n-propyl, $^iPr$ for isopropyl, $^nBu$ for n-butyl, $^tBu$ for tert-butyl, $^nPn$ for n-pentyl and $^tPn$ tert-pentyl. AMD stands for acetamidinate and FMD for formamidinate.

Examples of vanadium alkylamido precursors $V(NMe_2)_4$, $V(NEt_2)_4$ and $V(NEtMe)_4$. Exemplary vanadium dialkylamido precursors include $V(NMe_2)_4$, $V(NEt_2)_4$, and $V(NEtMe)_4$, (respectively named as tetrakis(dimethylamido)vanadium(IV), tetrakis(diethylamido)vanadium(IV), and tetrakis(ethylmethylamido)vanadium(IV)).

Examples of vanadium amidinate precursors are $V(^iPrAMD)_3$, $V(^tBuAMD)_3$, $V(^iPrFMD)_3$ and $V(^tBuFMD)_3$. Examples of vanadium alkoxide precursors are $V(OMe)_4$, $V(OEt)_4$, $V(O^nPr)_4$, $V(O^iPr)_4$, $V(O^iBu)_4$, $V(O^tBu)_4$, $V(O^iPn)_4$ and $V(O^nPn)_4$. Further, examples of vanadyl alkoxide precursors are $VO(OMe)_3$, $VO(OEt)_3$, $VO(O^nPr)_3$, $VO(O^iPr)_3$, $VO(O^iBu)_3$, $VO(O^tBu)_3$, $VO(O^iPn)_3$ and $VO(O^nPn)_3$.

Examples of vanadium beta-diketonate precursors are $V(acac)_3$ (tris-(2,4-pentanedionato)vanadium(IV)), $V(thd)_3$ (tris-(2,2,6,6-tetramethyl-3,5-hepanedionato)vanadium (IV)), $V(hfac)_3$ (tris-(1,1,1,5,5,5-Hexafluoro-2,4-pentanedionato)vanadium(IV)), $VO(acac)_2$ (oxobis(2,4-pentanedionato)vanadium(IV)), $VO(thd)_2$ (oxobis(2,2,6,6-tetramethyl-3,5-hepanedionato)vanadium(IV)) and $VO(hfac)_2$ (oxobis(1,1,1,5,5,5-Hexafluoro-2,4-pentanedionato)vanadium(IV)).

Vanadium cyclopentadienyl precursors include $VCp_2Cl_2$, $VCp_2$, $VCp_2(CO)_4$, (respectively named as bischlorobis (cyclopentdienyl)vanadium(IV), bis(cyclopentadienyl)vanadium(II), and cyclopentadienylvanadium tetracarbonyl)).

Additional exemplary vanadium cyclopentadienyl compounds include variations of these compounds, where Cp is either unsubstituted or bearing one or more alkyl groups, e.g., MeCp, EtCp, iPrCp, and the like.

Examples of inorganic vanadium precursors are vanadium halide precursors and vanadium oxyhalide precursors. The vanadium halide precursor can be selected from the group consisting of a vanadium fluoride, a vanadium chloride, a vanadium bromide, a vanadium iodide, and the like. The vanadium oxyhalide can be selected from the group consisting of a vanadium oxyfluoride, a vanadium oxychloride, a vanadium oxybromide, a vanadium oxyiodide, and the like.

Further, exemplary vanadium precursors can include "heteroleptic" or mixed ligand precursors, where any combination of the exemplary ligand types in any attainable number (typically 3-5 ligands, but there can be exceptions) can be attached to the vanadium atom. Examples could include $V(Cl)_x(NMe)_4$, and $V(Cl)_x(iPrAMD)_x$.

The nitrogen precursor may be selected from one or more of ammonia ($NH_3$), hydrazine ($N_2H_4$), and other compounds comprising or consisting of nitrogen and hydrogen. For example a mixture of nitrogen gas and hydrogen gas may be used. In an embodiment, the nitrogen precursor does not include diatomic nitrogen, i.e. the nitrogen precursor is a non-diatomic precursor.

Use of vanadium halide precursors can be advantageous relative to methods that use other precursors, such as vanadium metalorganic precursors, because the vanadium halide precursors can be relatively inexpensive, may result in vanadium layers with lower concentrations of impurities, such as carbon, and/or processes that use such precursors can be more controllable—compared to processes that use metalorganic or other vanadium precursors. Further, such reactants can be used without the assistance of a plasma to form excited species. In addition, processes that use vanadium halide may be easier to scale up, compared to methods that use organometallic vanadium precursors.

In an embodiment, the deposition process comprises the continuous flow of at least one precursor. In another embodiment, the flow of both precursors may be continuous. In another embodiment, the flow of two precursors may be at least partially simultaneous.

The cyclical deposition process can include one or more of an atomic layer deposition process and a cyclical chemical vapor deposition process. The cyclical deposition process may include a thermal process—i.e., a process that does not use plasma-activated species. In some cases, a reactant may be exposed to a plasma to form activated reactant species. In some embodiments, the cyclical deposition process may comprise only one or more thermal processes.

In an embodiment, temperature of the substrate within the reaction chamber during the cyclical deposition process is between about 20° C. and about 800° C. For example, the cyclical deposition process may comprise heating the substrate to a desired deposition temperature within the reaction chamber. The temperature may be less than 800° C. For example, heating the substrate to a deposition temperature may comprise heating the substrate to a temperature between approximately 20° C. and approximately 800° C. In some embodiments, the substrate temperature may be between about 100° C. and about 400° C., or between about 200° C. and about 500° C., for example 250° C., 300° C. or 450° C., or between about 20° C. and about 200° C.

In the case of thermal cyclical deposition processes, a duration of providing a precursor to the reaction chamber may be relatively long to allow the precursor to react with the another precursor or a derivative thereof. For example, the duration can be greater than or equal to 5 seconds or greater than or equal to 10 seconds or between about 5 and 10 seconds. In an embodiment, duration of providing the nitrogen precursor to the reaction chamber is greater than or equal to 5 seconds, or greater than or equal to 10 seconds, or between about 5 seconds and about 10 seconds.

In addition to controlling the temperature of the substrate, a pressure within the reaction chamber may also be regulated. For example, in some embodiments of the disclosure, the pressure within the reaction chamber may be less than 760 Torr or between 0.2 Torr and 760 Torr, between 1 Torr and 100 Torr, or between 1 Torr and 10 Torr.

In an embodiment, the surface of the substrate comprises a first surface material and a second surface material, and wherein the cyclical deposition process leads to the deposition of the vanadium nitride containing layer selectively on the first surface material relative to the second surface material.

In some embodiments a vanadium nitride-containing layer is selectively deposited on a first metal or metallic surface of a substrate relative to a second, dielectric surface of the substrate. In some embodiments the second surface comprises —OH groups, such as a $SiO_2$ based surface. In some embodiments a vanadium nitride is selectively deposited on a first metal, metallic, metal oxide or dielectric surface of a substrate relative to a second, different $SiO_2$ surface.

Unless otherwise indicated, if a surface is referred to as a metal surface herein, it may be a metal surface or a metallic surface. In some embodiments the metal or metallic surface may comprise metal, for example an elemental metal, metal nitride, metal silicide, metal carbide and/or mixtures thereof. In some embodiments the metal or metallic surface may comprise surface oxidation, for example a surface layer of native metal oxide. In some embodiments the metal or metallic material of the metal or metallic surface is electrically conductive with or without surface oxidation. In some embodiments the metal or metallic surface comprises silicon, such as H-terminated silicon. In some embodiments the metal or metallic surface is a silicon surface such as an H-terminated silicon surface. In some embodiments the metal or metallic surface is not a silicon surface such as a H-terminated silicon surface. The first metal or metallic surface may also be referred to herein as the first surface.

In some embodiments a metal or a metallic surface comprises one or more transition metals. In some embodiments a metal or metallic surface comprises aluminum. In some embodiments the metal or metallic surface comprises one or more of Al, Cu, Co, Ni, W. In some embodiments a metallic surface comprises titanium nitride. In some embodiments the metal or metallic surface comprises one or more noble metals, such as Ru. In some embodiments the metal or metallic surface comprises a conductive metal oxide, such as a noble metal oxide like $RuO_2$.

In some embodiments a material is selectively deposited on a first metal surface comprising a metal oxide surface. A metal oxide surface may be, for example a $WO_x$, $HfO_2$, $TiO_2$, $Al_2O_3$ or $ZrO_2$ surface. In some embodiments a metal oxide surface is an oxidized surface of a metallic material. In some embodiments a metal oxide surface is created by oxidizing at least the surface of a metallic material using oxygen compound, such as compounds comprising $O_3$, $H_2O$, $H_2O_2$, $O_2$, oxygen atoms, plasma or radicals or mixtures thereof. In some embodiments a metal oxide surface is a native oxide formed on a metallic material.

In some embodiments a vanadium nitride-containing layer is selectively deposited on a first surface comprising a dielectric surface relative to a second $SiO_2$ surface. The term dielectric is used herein for the sake of simplicity in distinguishing from the other surface, namely the metal or metallic surface. Unless indicated otherwise with respect to particular embodiments, the term dielectric in the context of this application can be understood to cover all surfaces which are electrically non-conducting or have very high resistivity. As used herein, the term "dielectric surface" may refer to a surface of dielectric material, including, but not limited to, silicon containing dielectric materials, such as, for example, silicon oxides, silicon nitrides, silicon oxynitrides, silicon oxycarbides, and mixtures thereof. In addition, the term "dielectric surface" may also refer to a surface of metal oxide material, or oxidized surface of metal nitride material.

In some embodiments the dielectric surface may be referred to herein as the second surface. In some embodiments the second surface may comprise any dielectric surface. In some embodiments a substrate is provided comprising a first metal or metallic surface and a second dielectric surface. In some embodiments a substrate is provided that comprises a first metal surface comprising a metal oxide surface. In some embodiments the second surface may comprise —OH groups. In some embodiments the second surface may be a $SiO_2$ based surface. In some embodiments the second surface may comprise Si—O bonds. In some embodiments the second surface may comprise a $SiO_2$ based low-k material. In some embodiments the second surface may comprise more than about 30%, preferably more than about 50% of $SiO_2$. In some embodiments the second surface may comprise $GeO_2$. In some embodiments the second surface may comprise Ge—O bonds.

In an embodiment, the first surface may comprise metal, and the second surface may comprise metal. In another embodiment, the first surface may comprise metal, and the second surface may comprise dielectric material. In another embodiment, the first surface may comprise dielectric material, and the second surface may comprise metal. In yet another embodiment, the first surface and the second surface comprise dielectric material.

In an embodiment, the selectivity of the deposition is at least 50%, or at least 80%, or at least 90%. In another embodiment, the selectivity of the deposition may be at least 95%, at least 98% or at least 99%. The selectivity of the deposition may be even at least 99.5% or about 100%. The selectivity of the deposition may alternatively be evaluated based on nucleation speed on a given surface material under given conditions. For example, the vanadium nitride-containing layer may start growing on the first surface material after one, two or three deposition cycles. Alternatively, the vanadium nitride-containing layer may start growing on the first surface material after ten deposition cycles. The vanadium nitride-containing layer may start growing on the second surface material after 50 deposition cycles, or after 100 deposition cycles.

In an embodiment, the selectivity of the deposition is regulated through etch-back during the cyclic deposition. By etch-back is herein meant a process which removes some of the already deposited layer between deposition cycles. Etch-back may increase selectivity, as it may slow down the layer growth more on the second surface material than on the first surface material. The method according to the current disclosure may comprise one or more etch-back phases, the interval, duration and other features of the etch-back phase(s) may be selected independently of deposition cycles. This allows adjusting the process to reach the desired layer selectivity, thickness etc.

In an embodiment, the vanadium nitride-containing layer is a seed layer. Seed layer may increase the rate of nucleation of another deposited material. This in turn, may lead to attainment of substantially or completely continuous layer with a lower number of deposition cycles, and improving layer integrity. This may allow depositing a thinner layer. Alternatively or in addition, the surface of the obtained layer may be smoother. This may be advantageous in, for example, avoiding defects in sensitive applications and applications comprising high aspect ratio structures. In an embodiment, a vanadium nitride-containing layer may be deposited as a seed layer before depositing a titanium nitride layer. The titanium nitride layer may be deposited from a $TiCl_4$ and $NH_3$ by using a cyclical deposition process.

It may be advantageous to use a vanadium nitride-containing layer as a seed layer before depositing a metal layer. Examples of metals that may be deposited on a vanadium nitride-containing seed layer are molybdenum, tungsten, copper and cobalt. The metal layer may function as a barrier metal, work function metal for logic or as a DRAM electrode, for example.

In an embodiment, the thickness of the seed layer is 0.6 nm or less, for example 0.4 nm. It may be possible to deposit a thin vanadium nitride-containing layer, which is substantially continuous. Such a layer may have advantages in structures where space is limited. The seed layer may be substantially continuous. In an embodiment, the seed layer may be non-continuous. The speed of nucleation may be improved also by a seed layer that is non-continuous. This may be desired, for example, to reduce the effect of the seed layer on the properties of the structure being produced.

In further embodiments, vanadium nitride-containing layer may be deposited on a seed layer, called an underlayer in the current disclosure. Using an underlayer between a substrate and a vanadium nitride-containing layer may allow for the deposition of a vanadium nitride-containing layer with reduced resistivity. Thus, it may be that using an underlayer allows for the deposition of a substantially or completely continuous vanadium-containing layer with a lower number of deposition cycles, improving layer integrity and/or surface smoothness, as described above. In some embodiments, an underlayer is deposited on a substrate comprising, consisting essentially of, or consisting of dielectric material. In some embodiments, the dielectric material is thermal oxide. In some embodiments, the dielectric material is thermal oxide.

Using an underlayer under a vanadium nitride-containing layer may be advantageous in applications in which vanadium nitride-containing layers having a thickness under 10 nm, or under 5 nm, or under 3 nm, or under 2 nm, or under 1.5 nm are used. In some embodiments, the thickness of an underlayer may be, for example, from about 0.05 nm to about to about 0.4 nm, or from about 0.1 nm to about 0.3 nm, such as about 0.15 nm, about 0.2 nm, about 0.25 nm or about 0.35 nm.

An underlayer may be substantially continuous. In some embodiments, the underlayer may be non-continuous. An underlayer may comprise various chemistries, such as silicon oxide or carbon containing metal oxide deposited as known in the art. In some embodiments, an underlayer is deposited in one to five deposition cycles, such as one, two or three deposition cycles.

As non-limiting examples of the method according to the current disclosure, when the vanadium nitride-containing layer according to the current disclosure comprises substantially only vanadium and nitride, and the thickness of the layer is approximately 50 Å, the resistivity of the film may be 200 µOhm cm or lower. When the thickness of the vanadium nitride-containing layer is approximately 40 Å, the resistivity may be less than 300 µOhm cm, and when the layer thickness approximately 30 Å, the resistivity may be less than 350 uOhm. Further, when the thickness of the vanadium nitride-containing film is approximately 20 Å, the resistivity may be less than 500 µOhm cm. The increase in resistivity of the vanadium nitride-containing layer may be slower compared to the resistivity increase of a TiN layer of similar thickness.

The method according to the current disclosure may be performed on single-wafer tools or in batch reactors. The reaction chamber can be a standalone reaction chamber or part of a cluster tool.

It may be possible to obtain good within wafer thickness non-uniformity and good down-boat thickness and resistivity performance for vanadium nitride-containing layer in batch deposition. In some embodiments the wafers rotate during processing. In some embodiments, a batch reactor comprises a reactor configured to accommodate 25 or more, 50 or more, 75 or more, 100 or more, 150 or more wafers vertically stacked on a boat. In other embodiments, the batch reactor may comprise a minibatch reactor configured to accommodate 10 or fewer wafers, 8 or fewer wafers, 6 or fewer wafers, 4 or fewer wafers, or 2 wafers. In some embodiments in which a batch reactor is used, and when the thickness of the vanadium nitride-containing layer is less than 20 nm, less than 15 nm, less than 10 nm, less than 7 nm, less than 5 nm, less than 4 nm or less than 3 nm, wafer-to-wafer non-uniformity of thickness or resistivity may be less than 20% (1 sigma), less than 10%, less than 5%, less than 3%, less than 2% or even less than 1%.

Within wafer non-uniformity of thickness or resistivity is less than 30% (1 sigma), less than 20%, less than 15%, less than 10%, less than 5%, less than 3%, less than 2%, less than 1% or even less than 0.5%.

In an embodiment, vanadium nitride-containing layer is used as an etch-stop layer. In another embodiment vanadium nitride-containing layer may be used as an etch-stop layer for metal oxides, such as for dielectric metal oxides, for example aluminum oxide.

In an embodiment, the cyclical deposition process includes annealing in the presence of $SiH_4$. Annealing may be used to reduce stress of the layer. Annealing may be performed during the cyclical deposition process. Alternatively, annealing may be performed after the cyclical deposition process. Annealing may be performed once. Alternatively, annealing may be performed several times at predetermined intervals during the cyclical deposition process. Annealing may affect layer properties by reducing layer intrinsic stress and/or thermal stress. Reduction of stress in a deposited layer may positively influence the properties of the final device.

In an embodiment, a silane compound, such as silane ($SiH_4$), disilane ($Si_2H_6$), trisilane ($Si_3H_8$) or tetrasilane ($Si_4H_{10}$) may be used in annealing. Further silane compounds include halosilanes, such as chlorosilanes, for example octochlorotrisilane (OCTS), HCDS (hexachlorodisilane) and DCS (dichlorosilane) may be used.

Without limiting the current disclosure to any specific theory, the annealing in the presence of silicon-containing compound, such as silanes, some amount of silicon may be incorporated into the layer. The amount of incorporated silicon may vary, and be adjustable, by selecting the annealing regime appropriately.

In an embodiment, the annealing may be performed at a temperature between 300° C. and 500° C., for example at a temperature of approximately 350° C., 370° C. or 400° C.

The disclosure is further explained by the following exemplary embodiments depicted in the drawings. The illustrations presented herein are not meant to be actual views of any particular material, structure, or device, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure.

FIG. 1 illustrates a method 100 in accordance with exemplary embodiments of the disclosure. Method 100 may be used to form a layer comprising vanadium nitride, i.e., a vanadium nitride-containing layer. The vanadium nitride-containing layer can be used during a formation of a device, such as a device noted herein. However, unless otherwise noted, methods are not limited to such applications.

Method 100 includes providing a substrate within a reaction chamber of a reactor (102) and depositing a layer comprising vanadium nitride onto a surface of the substrate (104).

During 102, a substrate is provided within a reaction chamber. The reaction chamber used during step 102 can be or include a reaction chamber of a chemical vapor deposition reactor system configured to perform a deposition process. The deposition process may be a cyclical deposition process. The reaction chamber can be a standalone reaction chamber or part of a cluster tool. The reaction chamber may be a batch processing tool.

Step 102 can include heating the substrate to a desired deposition temperature within the reaction chamber. In some embodiments of the disclosure, step 102 includes heating the substrate to a temperature of less than 800° C. For example, in some embodiments of the disclosure, heating the substrate to a deposition temperature may comprise heating the substrate to a temperature between approximately 100° C. and approximately 500° C., about 250° C. and about 450° C., about 250° C. and about 400° C., or about 200° C. and about 350° C.

In addition to controlling the temperature of the substrate, a pressure within the reaction chamber may also be regulated. For example, in some embodiments of the disclosure, the pressure within the reaction chamber during step 102 may be less than 760 Torr or between 0.5 Torr and 760 Torr, about 1 Torr and 100 Torr, such as or about 1 Torr and 10 Torr. The pressure may be, for example 10 Torr or less, 5 Torr or less, 3 Torr or less, 2 Torr or less, 1 Torr or less, 0.1 Torr or less or 0.001 Torr or less.

During step 104, the layer comprising vanadium nitride is deposited onto a surface of the substrate using a deposition process. As noted above, the deposition process may be a cyclical deposition process, and may include cyclical CVD, ALD, or a hybrid cyclical CVD/ALD process. For example, in some embodiments, the growth rate of a particular ALD process may be low compared with a CVD process. One approach to increase the growth rate may be that of operating at a higher deposition temperature than that typically employed in an ALD process, resulting in some portion of a chemical vapor deposition process, but still taking advantage of the sequential introduction of precursors. Such a process may be referred to as cyclical CVD. In some embodiments, a cyclical CVD process may comprise the introduction of two or more precursors into the reaction chamber, wherein there may be a time period of overlap between the two or more precursors in the reaction chamber resulting in both an ALD component of the deposition and a CVD component of the deposition. This is referred to as a hybrid process. In accordance with further examples, a cyclical deposition process may comprise the continuous flow of one reactant/precursor and the periodic pulsing of a second precursor into the reaction chamber. The temperature and/or pressure within a reaction chamber during step 104 can be the same or similar to any of the pressures and temperatures noted above in connection with step 102.

In accordance with some examples of the disclosure, the deposition process is a thermal deposition process. In these cases, the deposition process does not include use of a plasma to form activated species for use in the deposition process. For example, the deposition process may not comprise formation or use of plasma, may not comprise formation or use of excited species, and/or may not comprise formation or use of radicals. In the case of thermal cyclical deposition processes, a duration of the step of providing precursor to the reaction chamber can be relatively long to allow the precursor to react with another precursor or a derivative thereof. For example, the duration can be greater than or equal to 5 seconds or greater than or equal to 10 seconds or between about 5 and 10 seconds.

In other cases, a plasma can be used to excite one or more precursors, one or more precursors, and/or one or more inert gases.

The cyclical deposition process can include (e.g., separately and/or sequentially) providing a vanadium precursor to the reaction chamber and providing a nitrogen precursor to the reaction chamber. In some cases, a hydrogen reactant can be provided to the reaction chamber with the vanadium precursor or with the nitrogen precursor. The hydrogen reactant may comprise, for example, $H_2$ or excited, atomic, plasma or radical species of hydrogen.

FIG. 2 depicts an exemplary cyclical method 200 suitable for step 104 of method 100. Method 200 includes the steps of providing the vanadium precursor to the reaction chamber (step 202) and providing a nitrogen precursor to the reaction chamber (step 204). In accordance with examples of the disclosure, during the step of providing a nitrogen precursor to the reaction chamber (step 204), a vanadium nitride-containing layer is formed.

In some embodiments of the disclosure, method 100 includes repeating a unit deposition cycle that includes steps 202 and 204, with optional purge or move steps after step 202 and/or step 204. The deposition cycle can be repeated one or more times, based on, for example, desired thickness of the vanadium nitride-containing layer. For example, if the thickness of the vanadium nitride-containing layer is less than desired for a particular application, then steps 202 and 204 can be repeated one or more times. In some embodiments, the method comprises from at least 1 cycle to at most 100 cycles, or from at least 2 cycles to at most 80 cycles, or from at least 3 cycles to at most 70 cycles, or from at least 4 cycles to at most 60 cycles, or from at least 5 cycles to at most 50 cycles, or from at least 10 cycles to at most 40 cycles, or from at least 20 cycles to at most 30 cycles. In some embodiments, the method comprises at most 100 cycles, or at most 90 cycles, or at most 80 cycles, or at most 70 cycles, or at most 60 cycles, or at most 50 cycles, or at most 40 cycles, or at most 30 cycles, or at most 20 cycles, or at most 10 cycles, or at most 5 cycles, or at most 4 cycles, or at most 3 cycles, or at most 2 cycles, or a single cycle.

The vanadium precursor can comprise any of the precursors indicated in the current disclosure.

The reaction chamber can be purged using a vacuum and/or an inert gas to, for example, mitigate gas phase reactions between precursors and enable self-saturating surface reactions—e.g., in the case of ALD—before or after one or more steps. For example, the reaction chamber can be purged following one or more of steps 202, 204. Additionally or alternatively, the substrate may be moved to separately contact a first vapor phase precursor and a second vapor phase precursor. Surplus chemicals and reaction byproducts, if any, can be removed from the substrate surface or reaction chamber, such as by purging the reaction space or by moving the substrate, before the substrate is contacted with the next reactive chemical. The reaction chamber can be purged after the step of providing a precursor to the reaction chamber and/or after the step of providing a precursor to the reaction chamber.

In some embodiments, a step coverage of the vanadium nitride-comprising layer is equal to or greater than about 50%, or greater than about 80%, or greater than about 90%, or about 95%, or about 98%, or about 99% or greater, in/on structures having aspect ratios (height/width) of more than about 2, more than about 5, more than about 10, more than about 25, more than about 50, more than about 100, or between about 10 and 100 or about 5 to about 25.

In some embodiments, a growth rate of the vanadium nitride-containing layer can be relatively low—e.g., less 3 angstroms/cycle, between about 0.2 and 3 angstroms/cycle, or about 0.1 to about 1 angstrom/cycle. Alternatively, a growth rate of the vanadium nitride-containing layer can be less than 10 angstroms/cycle, or less than 5 angstroms/cycle or less than 4 angstroms/cycle. The relatively low growth rate can facilitate desired accuracy of film thickness and/or film thickness uniformity. However, faster growth rates can be attained when the process conditions are selected appropriately. The preferred layer growth rate depends on the application and can be selected by the skilled person as needed.

FIG. 3 illustrates a structure/a portion of a device 300 in accordance with additional examples of the disclosure. Device or structure 300 includes a substrate 302, dielectric or insulating material 305, and a layer comprising vanadium nitride 308. In the illustrated example, structure 300 also includes an additional conducting layer 310.

Substrate 302 can be or include any of the substrate material described herein.

Dielectric or insulating material 305 can include one or more dielectric or insulating material layers. For example, dielectric or insulating material 305 can include an interface layer 304 and a high-k material 306 deposited overlying interface layer 304. In some cases, interface layer 304 may not exist or may not exist to an appreciable extent. Interface layer 304 can include an oxide, such as a silicon oxide, which can be formed on a surface of the substrate 302 using, for example, a chemical oxidation process or an oxide deposition process. High-k material 306 can be or include, for example, a metallic oxide having a dielectric constant greater than about 7. In some embodiments, the high-k material has a dielectric constant higher than the dielectric constant of silicon oxide. Exemplary high-k materials include one or more of hafnium oxide ($HfO_2$), tantalum oxide ($Ta_2O_5$), zirconium oxide ($ZrO_2$), titanium oxide ($TiO_2$), hafnium silicate ($HfSiO_x$), aluminum oxide ($Al_2O_3$), lanthanum oxide ($La_2O_3$), and mixtures/laminates comprising one or more such layers.

A vanadium nitride-containing layer 308 can be formed according to a method described herein. When vanadium nitride-containing layer 308 is formed using a cyclical deposition process, a concentration of vanadium, nitrogen and/or other constituents in vanadium nitride-containing layer 308 can vary from a bottom of vanadium nitride-containing layer 308 to a top of vanadium nitride-containing layer 308 by, for example, controlling an amount of vanadium precursor and/or reactant(s) and/or respective pulse times or number of pulses during one or more deposition cycles. In some cases, vanadium nitride-containing layer 308 can have a stochiometric composition. A work function and other properties of vanadium nitride-containing layer 308 can be altered by altering an amount of vanadium, nitrogen, and/or other compounds in the layer or in a deposition cycle.

Layer comprising vanadium nitride 308 can include impurities, such as halides, hydrogen or the like in an amount of less than one atomic percent, less than 0.2 atomic percent, or less than 0.1 atomic percent, or less than 0.05 atomic percent, alone or combined.

A thickness of vanadium nitride-containing layer 308 can vary according to application. By way of examples, a thickness of vanadium nitride-containing layer 308 can be less than 5 nm or about 0.1 nm to about 10 nm, or about 0.1 nm to about 5 nm, or about 0.2 nm to about 5 nm, or about 0.3 nm to about 3 nm, or about 0.3 nm to about 1 nm. When used to replace layers that may include aluminum, rather than vanadium, vanadium nitride-containing layer 308 may be relatively thin, which may be desirable for many applications, including work function and/or voltage threshold adjustment layers. In some cases, a thickness of vanadium nitride-containing layer 308 can be greater than 2 nm—e.g., when vanadium nitride-containing layer 308 is used as a barrier layer or liner.

A work function of a shifted vanadium nitride-containing layer 308 can be >4.6 eV, >4.7 eV, >4.8 eV, >4.9 eV, >4.95 eV, or >5.0 eV. A work function value of a device can be shifted by about 30 meV to about 300 meV, or about 30 meV to about 200 meV, or about 50 meV to about 100 meV using a vanadium nitride-containing layer as described herein. A thickness and/or composition of the vanadium nitride-containing layer can be manipulated to obtain a desired shift in work function and/or threshold voltage.

Additionally or alternatively, layer comprising vanadium nitride 308 can form a continuous film—e.g., using method 100—at a thickness of <5 nm, <4 nm, <3 nm, <2 nm, <1.5 nm, <1.2 nm, <1.0 nm, or <0.9 nm. Vanadium nitride-containing layer 308 can be relatively smooth, with relatively low grain boundary formation. In some cases, vanadium nitride-containing layer 308 may be amorphous, with relatively low columnar crystal structures (as compared to TiN). RMS roughness of exemplary vanadium nitride-containing layer 308 can be <1.0 nm, <0.7 nm, <0.5 nm, <0.4 nm, <0.35 nm, or <0.3 nm, at a thickness of less than 10 nm.

Additional conducting layer 310 can include, for example, metal, such as a refractory metal or the like. By way of examples, conducting layer 310 can be or include one or more of titanium nitride; vanadium nitride; a metal stack including titanium nitride and a metal (e.g., W, Co, Ru, Mo) or titanium nitride, titanium aluminum carbon, and titanium nitride; tungsten; tungsten carbon nitride; cobalt; copper; molybdenum, ruthenium; or the like.

Although illustrated with vanadium nitride-containing layer 308 overlying dielectric or insulating material 305, in some cases, vanadium nitride-containing layer 308 can additionally or alternatively be formed directly over substrate 302 (which can include various layers and/or topologies) and/or underlying dielectric or insulating material 305, between interface layer 304 and high-k material 306, and/or between layers of high-k material 306. Further, vanadium nitride-containing layer 308 may be deposited and at least partially removed, such that resultant structures may no longer include vanadium nitride-containing layer 308 or include a lesser number of layers comprising vanadium nitride than were initially formed on the structure.

Figure 4:
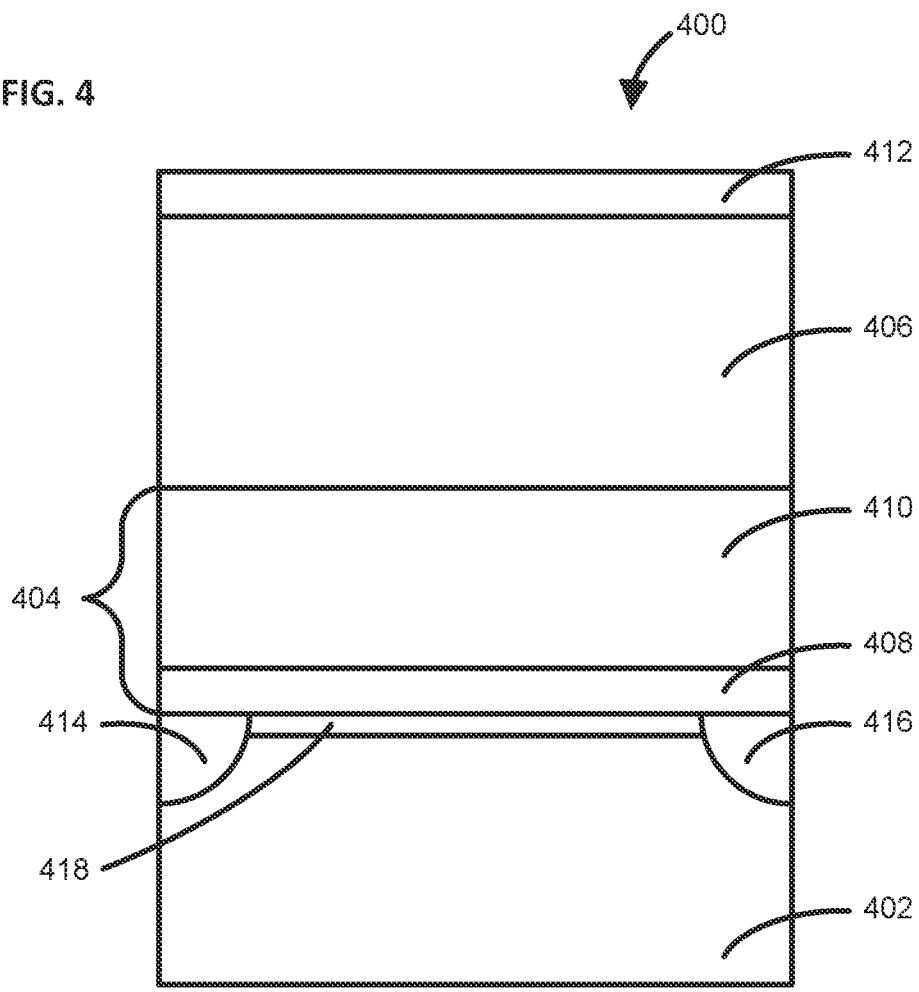
FIG. 4 depicts another exemplary structure according to the current disclosure.

FIG. 4 illustrates another exemplary structure 400 in accordance with examples of the disclosure. Device or structure 400 includes a substrate 402, dielectric or insulating material 404, and vanadium nitride-containing layer 406. In the illustrated example, structure 400 also includes an additional conducting layer 412. Substrate 402, dielectric or insulating material 404, vanadium nitride-containing layer 406, and an additional conducting layer 412 can be the same or similar to substrate 402, dielectric or insulating material 404, vanadium and/or vanadium nitride-containing layer 408 and conducting layer 410. Similar to above, vanadium nitride-containing layer 406 can additionally or alternatively be formed overlying substrate 402 (which can include various layers and/or topologies) and/or underlying insulating material 404, between interface layer 408 and high-k material 410, and/or between layers of high-k material 410. Further, vanadium nitride-containing layer 406 may be deposited and at least partially removed, such that resultant structures may no longer include vanadium nitride-containing layer 406 or include a lesser number of layers comprising vanadium nitride 406 than were initially formed on the structure.

In the illustrated example, substrate 402 includes a source region 414, a drain region 416, and a channel region 418. Although illustrated as a horizontal structure, structures and devices in accordance with examples of the disclosure can include vertical and/or three-dimensional structures and devices, such as FinFET devices, gate all around devices and nanosheet devices.

Figure 5:
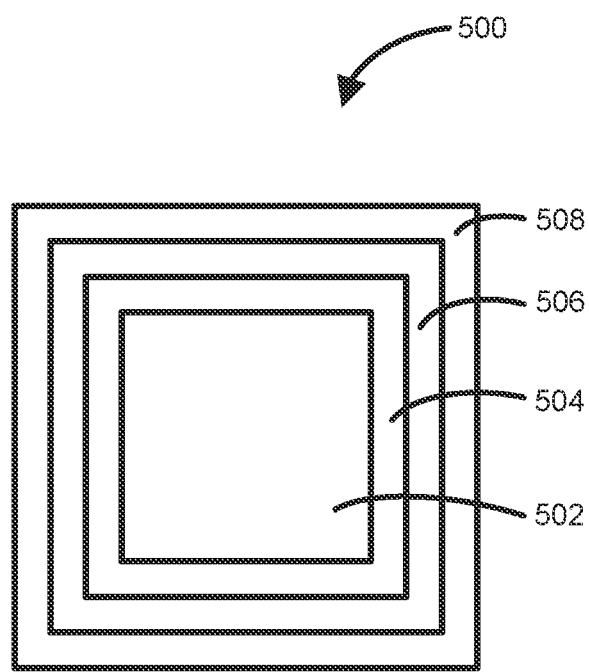
FIG. 5 shows yet another exemplary structure according to the current disclosure.

FIG. 5 illustrates another structure 500 in accordance with examples of the disclosure. Structure 500 is suitable for gate all around field effect transistor (GAA FET) (also referred to as lateral nanowire FET) devices and the like.

In the illustrated example, structure 500 includes semiconductor material 502, dielectric material 504, a vanadium nitride-containing layer 506, and a conducting layer 508. Structure 500 can be formed overlying a substrate, including any substrate materials described herein.

Semiconductor material 502 can include any suitable semiconducting material. For example, semiconductor material 502 can include Group IV, Group III-V, or Group II-VI semiconductor material. By way of example, semiconductor material 502 includes silicon.

Dielectric material 504, vanadium nitride-containing layer 506, and conducting layer 508 can be the same or similar to dielectric or insulating material 305, vanadium nitride-containing layer 308 and conducting layer 310, described above. Vanadium nitride-containing layer 506 can be formed overlying semiconductor material 502 and/or underlying dielectric material 504 in accordance with further examples of the disclosure.

Figure 6:
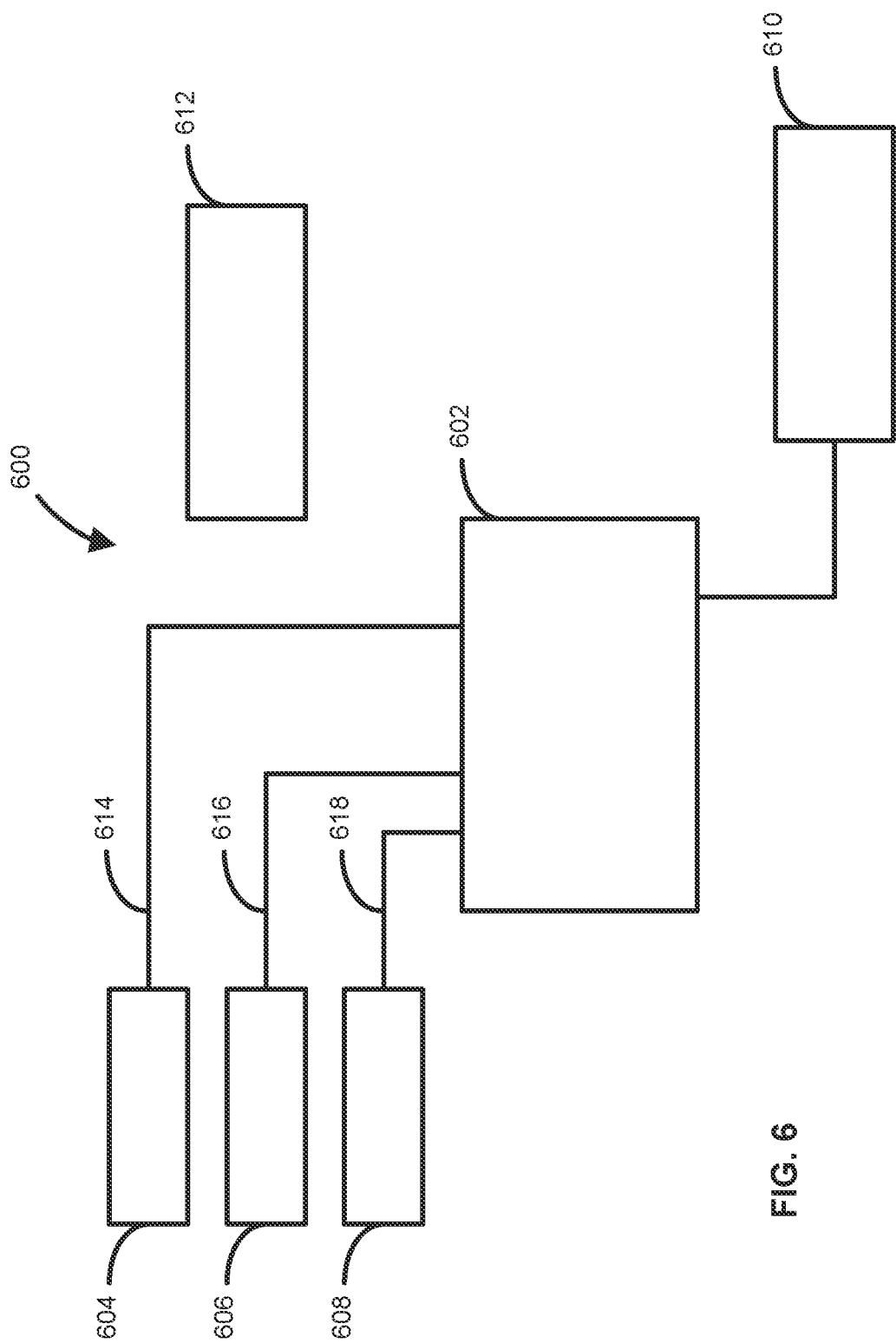
FIG. 6 presents a deposition apparatus according to the current disclosure in a schematic manner.

FIG. 6 illustrates a deposition apparatus 600 in accordance with yet additional exemplary embodiments of the disclosure. Apparatus 600 can be used to perform a method as described herein and/or form a structure or device portion as described herein.

In the illustrated example, apparatus 600 includes one or more reaction chambers 602, a first precursor gas source 604, a second precursor gas source 606, a purge gas source 608, an exhaust source 610, and a controller 612.

Reaction chamber 602 can include any suitable reaction chamber, such as an ALD or CVD reaction chamber.

The first precursor gas source 604 can include a vessel and one or more vanadium precursors as described herein—alone or mixed with one or more carrier (e.g., inert) gases. Second precursor gas source 606 can include a vessel and one or more precursors (e.g., nitrogen precursor) as described herein—alone or mixed with one or more carrier gases. Purge gas source 608 can include one or more inert gases as described herein. Although illustrated with three gas sources 604-608, apparatus 600 can include any suitable number of gas sources. Gas sources 604-608 can be coupled to reaction chamber 602 via lines 614-618, which can each include flow controllers, valves, heaters, and the like.

Exhaust source 610 can include one or more vacuum pumps.

Controller 612 includes electronic circuitry and software to selectively operate valves, manifolds, heaters, pumps and other components included in the apparatus 600. Such circuitry and components operate to introduce precursors, reactants, and purge gases from the respective sources 604-608. Controller 612 can control timing of gas pulse sequences, temperature of the substrate and/or reaction chamber, pressure within the reaction chamber, and various other operations to provide proper operation of the apparatus 600. Controller 612 can include control software to electrically or pneumatically control valves to control flow of precursors, reactants and purge gases into and out of the reaction chamber 602. Controller 612 can include modules such as a software or hardware component, e.g., a FPGA or ASIC, which performs certain tasks. A module can advantageously be configured to reside on the addressable storage medium of the control system and be configured to execute one or more processes.

Other configurations of apparatus 600 are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into reaction chamber 602. Further, as a schematic representation of an apparatus, many components have been omitted for simplicity of illustration, and such components may include, for example, various valves, manifolds, purifiers, heaters, containers, vents, and/or bypasses.

During operation of deposition apparatus 600, substrates, such as semiconductor wafers (not illustrated), are transferred from, e.g., a substrate handling system to reaction chamber 602. Once substrate(s) are transferred to reaction chamber 602, one or more gases from gas sources 604-608, such as precursors, reactants, carrier gases, and/or purge gases, are introduced into reaction chamber 602.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

We claim:

1. A method of forming a sequence of layers on a substrate, the method comprising
   providing the substrate within a reaction chamber of a reactor;
   depositing an underlayer on a surface of the substrate;
   depositing, via a first cyclical deposition process, a vanadium nitride-containing layer onto the underlayer,
   wherein the first cyclical deposition process comprises:
      providing a vanadium precursor to the reaction chamber; and
      providing a nitrogen precursor to the reaction chamber.

2. The method of claim 1, wherein after the first cyclical deposition process, the method further comprises depositing, via a second cyclical deposition process, a titanium nitride layer onto the vanadium nitride-containing layer.

3. The method of claim 2, wherein the second cyclical deposition process includes:
   providing a $TiCl_4$ precursor to the reaction chamber; and
   providing an $NH_3$ precursor to the reaction chamber.

4. The method of claim 1, wherein the reaction chamber is purged between providing the vanadium precursor to the reaction chamber and providing the nitrogen precursor to the reaction chamber.

5. The method of claim 1, wherein the nitrogen precursor is selected from one or more of ammonia ($NH_3$), hydrazine ($N_2H_4$), and other compounds comprising or consisting of nitrogen and hydrogen.

6. The method of claim 1, wherein the nitrogen precursor does not include diatomic nitrogen.

7. The method of claim 1, wherein:
   the surface of the substrate comprises a first surface material and a second surface material, and
   the first cyclical deposition process produces a selectivity of deposition of the vanadium nitride-containing layer on the first surface material relative to the second surface material.

8. The method of claim 7, wherein the selectivity of deposition is at least 80%.

9. The method of claim 7, wherein the selectivity of deposition is regulated through etch-back during the first cyclical deposition process.

10. The method of claim 7, wherein the first surface material comprises metal, metallic, metal oxide or dielectric surface.

11. The method of claim 1, wherein a thickness of the vanadium-nitride layer is 0.6 nm or less.

12. The method of claim 1, wherein the vanadium-nitride layer is non-continuous.

13. The method of claim 1, wherein the first cyclical deposition process includes annealing in with a silane compound that is present.

14. The method of claim 13, wherein the silane compound is $SiH_4$.

15. A method of forming a structure of a device, the method comprising:
   providing a substrate within a reaction chamber of a reactor, the substrate comprising one or more dielectric or insulating material layers;
   depositing, via a first cyclical deposition process, a vanadium nitride-containing layer onto a top layer of the one or more dielectric or insulating material layers,
   wherein the first cyclical deposition process comprises:
      providing a vanadium precursor to the reaction chamber; and
      providing a nitrogen precursor to the reaction chamber.

16. The method of claim 15, wherein the vanadium nitride-containing layer is configured to function as at least one of a work function metal, a barrier, a metal electrode, a p-metal gate, or a dipole (p) tuning layer.

17. The method of claim 15, wherein a work function of the vanadium nitride containing layer is greater than 4.6 eV.

18. The method of claim 15, wherein after the first cyclical deposition process, the method further comprises depositing, via a second cyclical deposition process, a titanium nitride layer onto the vanadium nitride-containing layer.

19. The method of claim 15, wherein the vanadium nitride-containing layer is configured to function as a barrier layer.

20. The method of claim 19, wherein the barrier layer includes a thickness of less than 5 nm.

* * * * *